(12) United States Patent
Weng

(10) Patent No.: US 6,463,564 B1
(45) Date of Patent: Oct. 8, 2002

(54) MIS-SYNCHRONIZATION DETECTION SYSTEM

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/395,840

(22) Filed: Sep. 14, 1999

(51) Int. Cl.$^7$ .............................................. H03M 13/00
(52) U.S. Cl. ........................ 714/784; 714/755; 714/782
(58) Field of Search ................................. 714/784, 755, 714/752, 775, 782

(56) References Cited

U.S. PATENT DOCUMENTS 4,989,211 A * 1/1991 Weng .......................... 714/775
5,528,607 A * 6/1996 Weng et al. .................. 714/775

* cited by examiner

Primary Examiner—Phung M. Chung
(74) Attorney, Agent, or Firm—Cesari and McKenna, LLP

(57) ABSTRACT

An error correction system produces a code word for recording by XOR'ing to a data code word that is encoded in accordance with a distance d Reed-Solomon code a coset leader that is a code word of a distance d' super code of the distance d code, but not a code word of the distance d code. When the code word is later retrieved, the system XOR's the coset leader to the retrieved code word. If there is no synchronization error, the XOR'ing operation reproduces the original data code word. If, however, there is a synchronization error, the XOR'ing operation introduces into the retrieved code word a term that is a Hamming distance of d' from every valid code word of the distance d Reed-Solomon code. The result should then contain more errors than the ECC can correct, as long as $$d' > \frac{d}{2}.$$

The system determines the super code from which to select the coset leader based on the generator polynomial of the distance d Reed-Solomon code. For a code with a generator polynomial which has consecutive roots $\alpha^L \alpha^{L+1} \alpha^{L+2} \ldots \alpha^{L+d-1}$, where "$\alpha$" is a primitive element of $GF(2^q)$, the system first selects as the super code a distance d−1 Reed-Solomon code with a generator polynomial that has d−1 consecutive roots. The system then selects from such a code a coset leader $b(x)$ that is not also a code word of the distance d code. The system next checks that the term $j(x)=b(x)*x^S+b(x)$ is not a valid code word of the distance d code for every $S$ of interest, where $-T \leq S \leq T$ and T is the maximum number of symbols by which the read/write head may be mis-synchronized. If $j(x)$ is a valid code word of the distance d−1 code, the system selects and tests each of the remaining coset leaders from the distance d−1 codes. If none of them are appropriate, the system selects and tests the coset leaders from a distance d−2 Reed-Solomon code that has a generator polynomial with d−2 consecutive roots, and so forth. To reduce the system storage requirements, the coset leader may be selected to be a code word produced by manipulating a shortened code word of the distance d' code. The system then stores the shortened code word and performs the necessary manipulations to produce the coset leader.

24 Claims, 5 Drawing Sheets

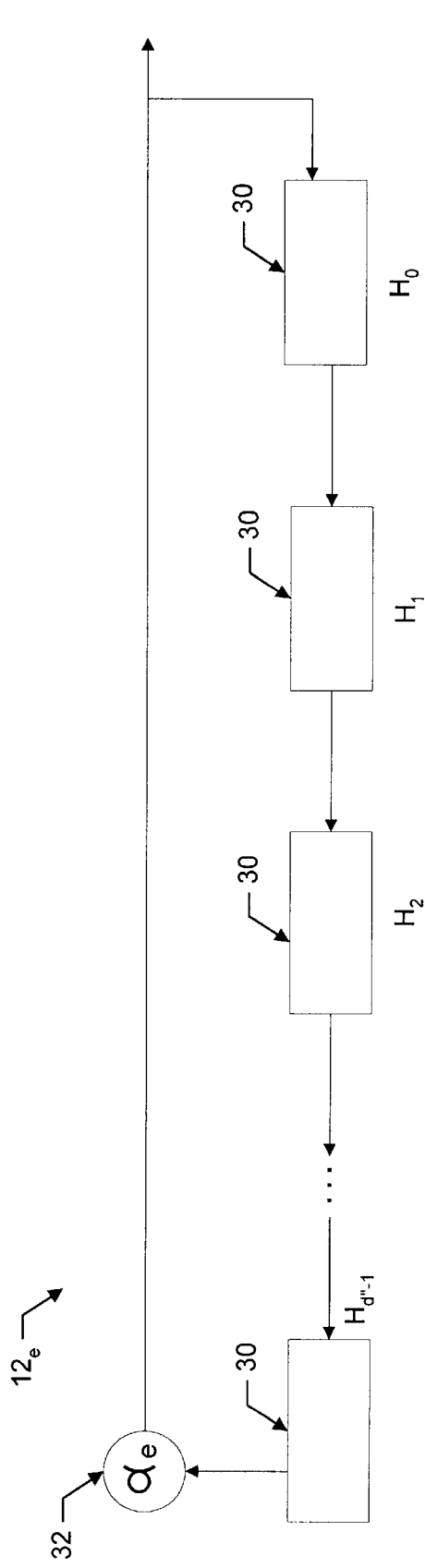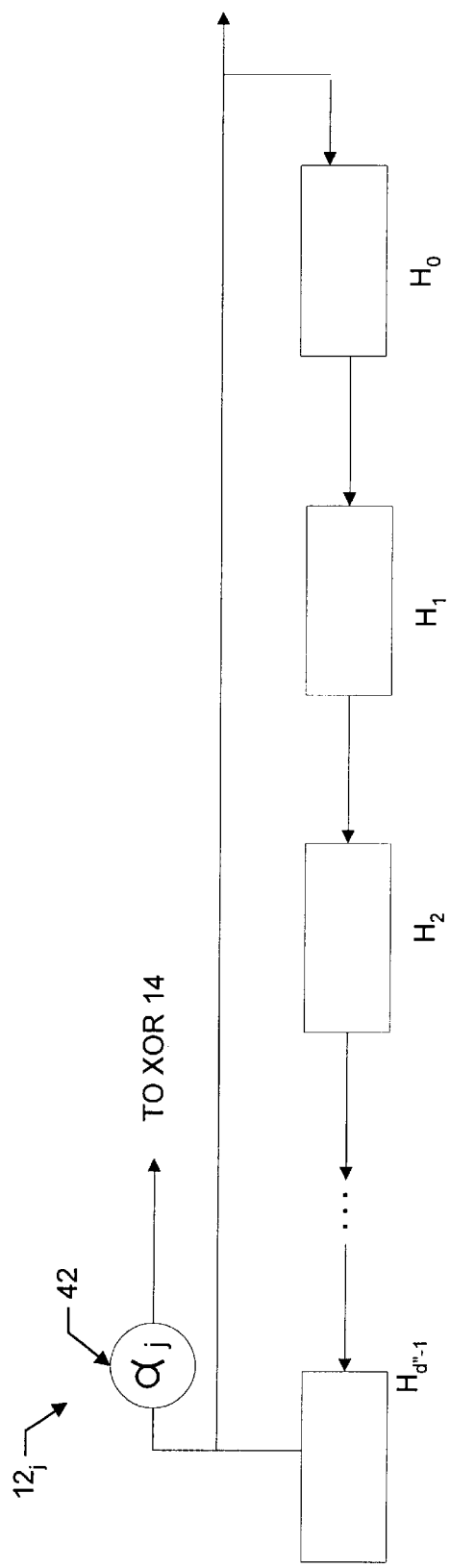
FIG. 5
FIG. 6

MIS-SYNCHRONIZATION DETECTION SYSTEM

BACKGROUND OF THE INVENTION

Data is recorded on magnetic disks in tracks that are separated into sectors. Each sector includes a header portion that lists the sector number and other information, and a data portion in which the data are recorded. Synchronization information is also included between the sectors, so that a disk drive can determine the start of the sector and ultimately the start of the data portion of the sector.

Before recording, the data are typically encoded into data code words using an error correction code (ECC). The data code word is then recorded in the data portion of the sector. To later read the data, a disk drive moves a read/write head over the appropriate track and, using the recorded synchronization information, determines the start of the data portion of the sector of interest. The head then reads the data code word and supplies it to a decoder. The decoder reproduces the data by manipulating the code word symbols and, as necessary, correcting any errors using the ECC.

If the drive makes a mistake in determining the location of the start of the data code word, that is, if there is a synchronization error, the drive reads a portion of the data code word and either information that precedes the data code word or information that follows the data code word, depending on the direction of the synchronization error. If the decoder mistakenly interprets what is read from the disk as a valid data code word. The decoder then "corrects" what it perceives as errors in the code word, and sends the result as error-free data to an application or a user.

The ECCs that are most often used are Reed-Solomon codes. The Reed-Solomon codes encode the data over a Galois Field ($2^q$) where "q" is the number of bits in a code symbol or element. The Reed-Solomon codes are cyclic. Accordingly, if $c_0 c_1 \ldots c_c$ is an unshortened code word, where the $c_j$ are elements of $GF(2^p)$, $c_1 \ldots c_c c_0$ is also a code word, as is $c_c c_0 c_1 \ldots c_{c-1}$. This means that a synchronization error of one or more symbols may produce a different, but valid code word. If the mis-synchronization involves a number of bits rather than full symbols, the decoder most likely detects that every code word symbol is in error. Accordingly, the decoder cannot correct the errors, and labels the data as erroneous.

To protect against the misinterpretation of the symbol-sized synchronization errors, a certain prior system adds a noise-like sequence into each data code word before the code word is recorded. Using Galois Field operations, the addition is accomplished by XOR'ing the sequence and the data code word. Before decoding, the system removes the sequence by XOR'ing it to the retrieved code word. If the read operation is synchronized to the start of the codeword, that is, if there is no synchronization error, the XOR'ing of the sequence and the retrieved code word reproduces the original data code word.

Otherwise, the XOR'ing of the sequence to the retrieved code word introduces errors into the code word. Assuming the sequence is properly chosen, the decoder then detects more errors than the ECC can correct, and it labels the mis-synchronized data as erroneous. If the sequence is not properly chosen, the XOR'ing operation may instead produce a different and valid code word that can be "corrected" by the ECC.

The prior system uses a trial and error approach to finding the noise-like sequence. The trial and error approach is time consuming and does not necessarily produce a sequence that introduces a maximum number of errors into a retrieved code word that contains synchronization errors. Further, the prior systems have to store the selected sequence in the encoder, which increases the overall storage requirements of the system. Accordingly, the mis-synchronization technique may be impractical for systems that have limited storage capacities.

SUMMARY OF THE INVENTION

An error correction system produces a code word for recording by XOR'ing to a data code word that is encoded in accordance with a distance d Reed-Solomon code a coset leader that is a code word of a distance d' super code of the distance d Reed-Solomon code. The coset leader is chosen such that it is not a code word of the distance d code. When the code word is later retrieved, the system XOR's the coset leader to the retrieved code word. If there is no synchronization error, the XOR'ing operation reproduces the original data code word. If, however, there is a synchronization error, the XOR'ing operation introduces into the retrieved code word a term that is a Hamming distance of d' from every valid code word of the distance d Reed-Solomon code. The result should then contain more errors than the ECC can correct, as long as $$d' > \frac{d}{2}.$$

The system determines the super code from which to select the coset leader based on the generator polynomial of the distance d Reed-Solomon code. For a code with a generator polynomial which has consecutive roots $\alpha^L \alpha^{L+1} \alpha^{L+2} \ldots \alpha^{L+d-1}$, where "$\alpha$" is a primitive element of $GF(2^q)$, the system first selects as the super code a distance d−1 Reed-Solomon code with a generator polynomial that has d−1 consecutive roots. Accordingly, the super code has a generator polynomial with roots $\alpha^{L+1} \alpha^{L+2} \ldots \alpha^{L+d-1}$ or roots $\alpha^L \alpha^{L+1} \alpha^{L+2} \ldots \alpha^{L+d-2}$. The system then selects from one of these codes a coset leader $b(x)$ that is not also a code word of the distance d code.

The system next checks that the term $j(x)=b(x)*x^S+b(x)$ is not a valid code word of the distance d code for every S of interest, where $-T \leq S \leq T$ and T is the maximum number of symbols by which the read/write head may be mis-synchronized, as discussed in more detail below. If $j(x)$, which is necessarily a code word of the distance d−1 code, is not also a code word of the distance d code, the XOR'ing of $b(x)$ to a retrieved code word that includes synchronization errors introduces into the code word a term that is a minimum Hamming distance of d−1 from every valid code word of the distance d code.

If $j(x)$ is a valid code word of the distance d code, the system selects and tests each of the remaining coset leaders from the distance d−1 codes. If none of them are appropriate, the system selects and tests the coset leaders from a distance d−2 Reed-Solomon code that has a generator polynomial with d−2 consecutive roots, and so forth.

To reduce the system storage requirements, the coset leader may be selected to be a code word that contains r+1 versions of a shortened code word of the distance d' code. The coset leader is thus:

$$b_i(x) = x^{p} * m(x) * g'(x) * [1 + x^{d''} + x^{2d''} + x^{3d''} + \ldots + x^{rd''}]$$

with d" greater than or equal to the degree of $m(x)*g'(x)$ and $p+rd''+d'-1 \leq n$, where $g'(x)$ is the generator polynomial of the distance d' code and n is the code length. The term m(x) may be selected to be an irreducible polynomial, and p and d" are selected as discussed below. The system then stores the shortened code word rather than the entire coset leader, and XOR's the shortened code word r+1 times to the symbols of the data code word.

The system may instead generate the coset leader by repeatedly multiplying the shortened codeword by $\alpha^e$, and the coset leader is $$b_i(x)=x^{P}*m(x)*g'(x)*[1+\alpha^{e}*x^{d''}+\alpha^{2e}*x^{2d''}+\ldots+\alpha^{re}*x^{rd''}],$$

which is readily produced using a linear feedback shift register that in its initial state contains the coefficients of $x^P*m(x)*g'(x)$ and in each iteration multiplies the contents by $\alpha^e$. The desirable values of r and e are such that $\alpha^{(r+1)e}=1$ and the shift register thus returns to its initial state after r iterations. Otherwise, the system reloads the register to its original state after the r iterations. The shift register may instead multiply the shortened code word by arbitrary values of $\alpha^j$, as discussed in more detail below.

The system may also generate the "data" portion of the coset leader using an m-bit binary maximal length linear feedback shift register that is set to a predetermined initial condition. The system stores the associated redundancy symbols, however, to avoid having to include in the system a separate encoder for the distance d' code.

Alternatively, the system may XOR the coset leader to only the redundancy symbols of the data code word, and preserve the data symbols. The selected coset leader may then be $x^P*g'(x)$ for p=0, 1 ..., d−d'−1, with the value of p chosen to "center" the coset leader over the redundancy symbols, as discussed in more detail below.

BRIEF DESCRIPTION OF THE DRAWINGS

The invention description below refers to the accompanying drawings, of which:

FIG. 5 is a functional block diagram of a shift register for generating a coset leader;

FIG. 6 is a functional block diagram of an alternative shift register for generating a coset leader.

DETAILED DESCRIPTION OF AN ILLUSTRATIVE EMBODIMENT

The inventive system is discussed below in terms of Reed-Solomon codes.

However, the system may be used also with BCH codes. The addition and multiplication operations discussed below are Galois Field operations.

Figure 1:
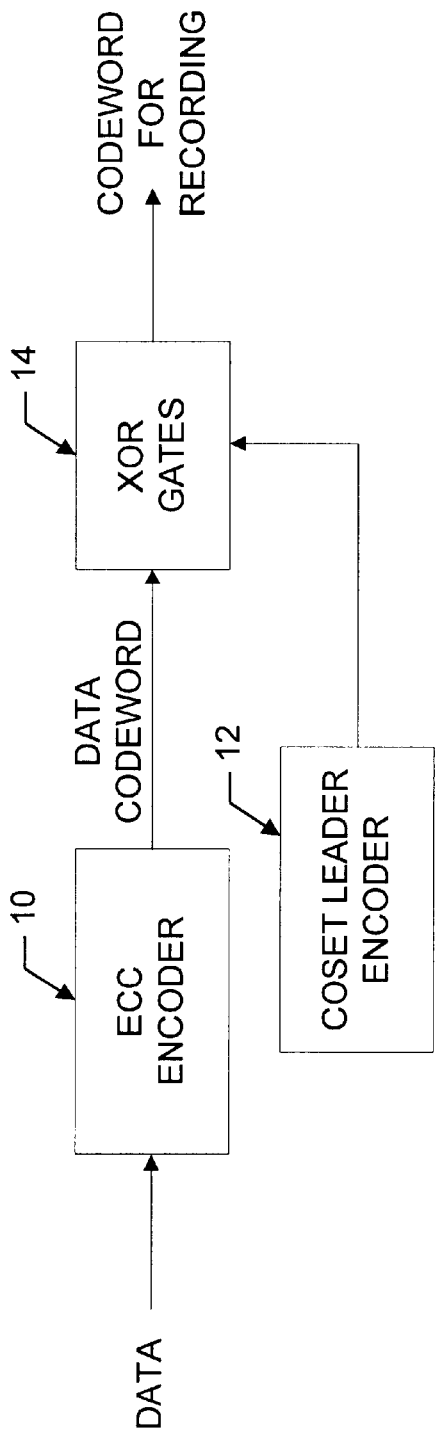
FIG. 1 is a functional block diagram of an encoding system constructed in accordance with the invention.

Referring now to FIG. 1, an ECC encoder 10 encodes data in accordance with a distance d Reed-Solomon ECC, to produce a-data code word c(x). The data code word is supplied to XOR gates 14, which add to the code word a coset leader $b_i(x)$. As discussed in more detail below, the coset leader is a code word of a distance d' super code of the ECC, where d'<d, but is not a code word of the distance d code. The result is then recorded in a conventional manner by a disk drive (not shown).

Figure 2:
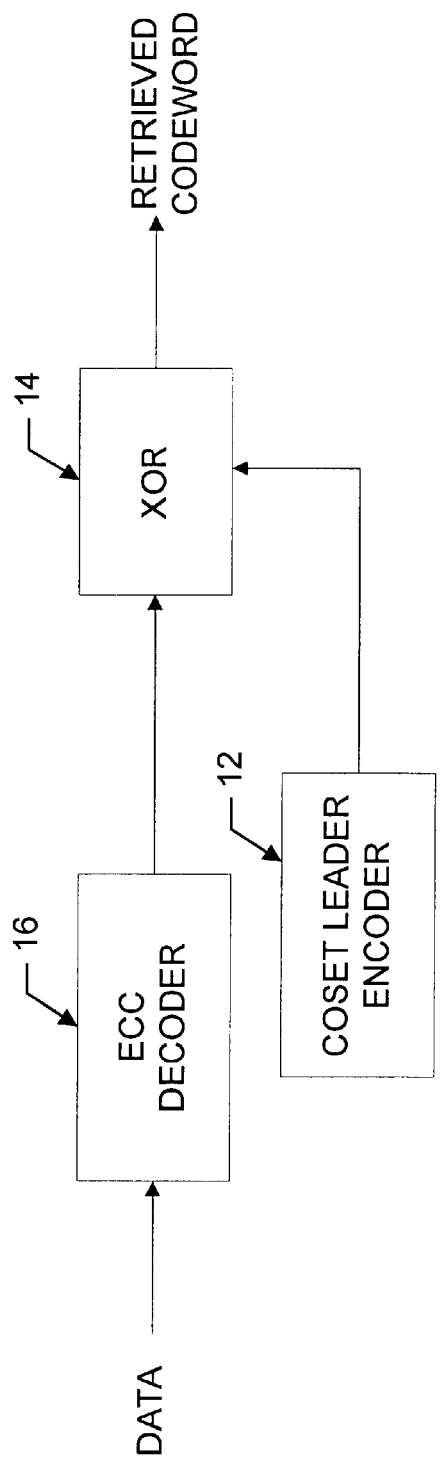
FIG. 2 is a functional block diagram of a decoding system constructed in accordance with the invention.
Figure 3:
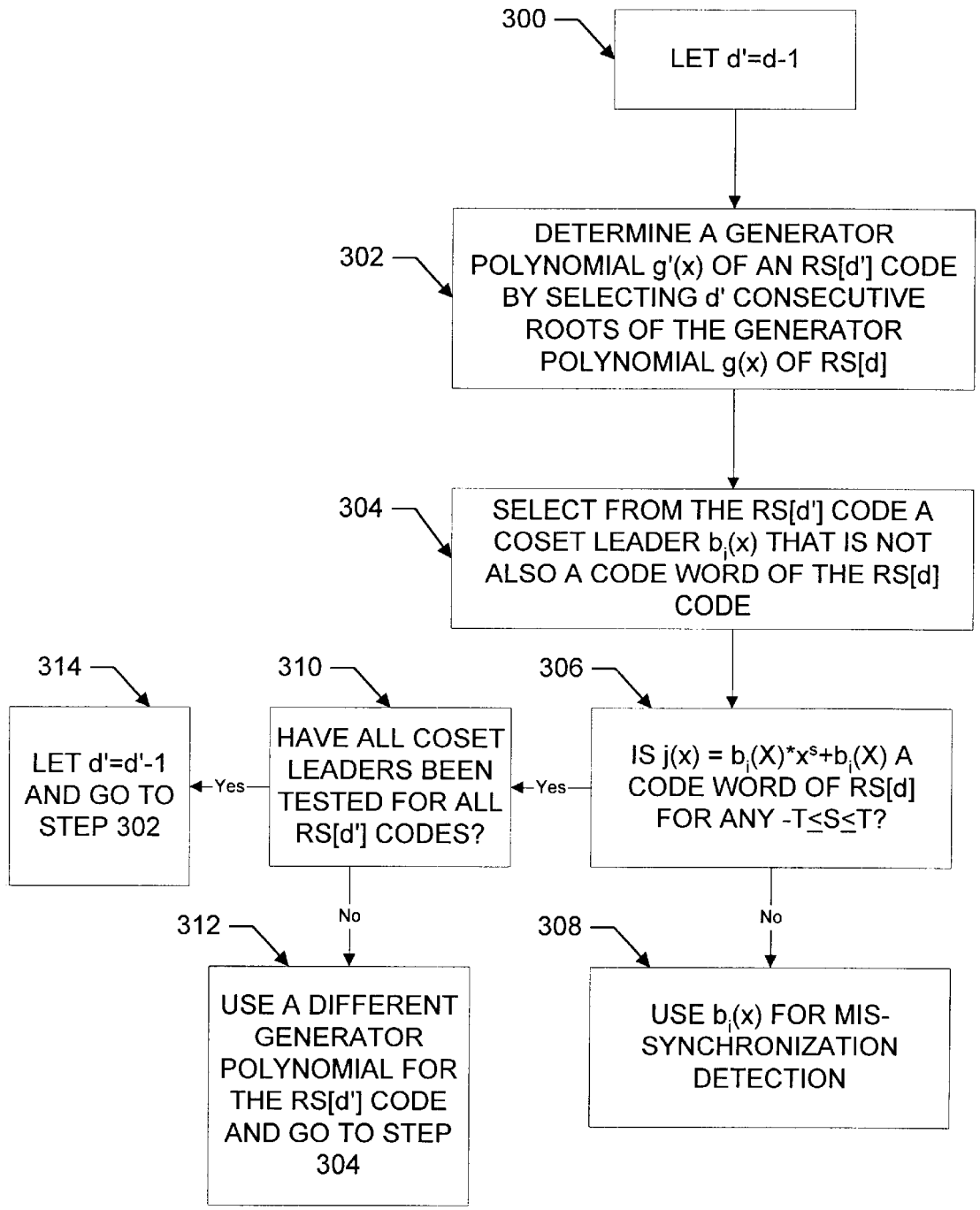
FIG. 3 is a flow chart of the operations of selecting a coset leader.

Referring also to FIG. 2, when the code word is later retrieved, the coset leader is removed from the code word by again XOR'ing the coset leader to the codeword. The result is then decoded by the decoder 16 in a conventional manner in accordance with the distance d ECC. As appropriate, the decoder 16 corrects the errors in the decoded code word, to reproduce the data.

If the retrieved code word contains synchronization errors, adding the coset leader to the retrieved code word introduces further errors into the code word. As discussed below, the coset leader is selected such that the XOR'ing operation includes in the retrieved code word a term that is a Hamming distance of d' from every valid codeword of the distance d ECC. The inclusion of this term in the code word results in a greater number of errors in the mis-synchronized code word than the ECC can correct, and the decoder thus labels the data as erroneous.

More specifically, the data code word produced by the ECC encoder 10 is a code word of the distance d Reed-Solomon code, which is referred to herein also as an RS[d] code. By definition, the data code words are separated from each other by a minimum Hamming distance d. The RS[d] code is contained in the codes RS[2], RS[3] ... RS[d−1], that have code words that are separated respectively by minimum Hamming distances of 2, 3 ..., d−1. These RS[d'] codes are super codes of the RS[d] code, since they include all of the distance d codewords as well as code words that are a lesser distance d' from each is of the other code words.

The system selects to XOR to the data code word c(x) a coset leader $b_i(x)$ that is a code word of the RS [d'] code but is not also a code word of the RS [d] code. The system thus XOR's to the data code word a term that is a Hamming distance d' from every valid data code word, to produce for recording the code word $c(x)+b_i(x)$ w(x). When the code word is later retrieved, the coset leader bi(x) is removed by again XOR'ing it to the code word. If there is no synchronization error, the system reproduces the data codeword:

$$w(x)+b_i(x)=c(x)+b_i(x)+b_i(x)=c(x).$$

If there is a synchronization error, however, the retrieved codeword is shifted, in time, by S symbols, where $-T \leq S \leq T$ and T is the maximum number of symbols in a synchronization error, as discussed below. The retrieved codeword $c_R(x)$ contains a shifted and truncated version of the recorded codeword and S symbols that either precede or follow the recorded code word symbols, depending on the direction of the mis-synchronization. The retrieved code word thus contains the term $c_r(x)$=TRUNCATE $\{c(x)*x^S + b_i(x)*x^S\}$, where the function TRUNCATE{} is defined for a polynomial $$f(x)=f_{n+k}x^{n+k}+f_{n+k-1}x^{n+k-1}\ldots f_1x+f_0+f_{-1}x^{-1}+f_{-2}x^{-2}+\ldots+f_{-L}x^{-L}$$

with both positive and negative powers of x as TRUNCATE $\{f(x)\}=f_{n-1}x^{n-1}+f_{n-2}x^{n-2}+\ldots+f_1x+f_0$ where n is the code length.

The XOR'ing of the coset leader to a retrieved codeword with synchronization errors introduces into the code word the term:

$$r(x)=\text{TRUNCATE }\{c(x)*x^S+b_i(x)*x^S+b_i(x)\}.$$

Accordingly, the system tests, for every value of S of interest, that $j(x)=b_i(x)*x^S+b_i(x)$ is not a code word of the RS

[d] code, to ensure that the coset leader provides the desired mis-synchronization properties. Without truncation, the term included in the mis-synchronized retrieved code word is a distance of d' from every valid data code word, and it should introduce into the mis-synchronized retrieved code word $C_R(X)$ more errors than the ECC can correct. As discussed in more detail below, a particular coset leader may be selected so as to minimize the potentially adverse effects of the truncation on the associated Hamming distance.

A generator polynomial of the RS[d'] code can be determined by selecting d' factors of the generator polynomial of the RS[d] code. For an RS [d] code with a generator polynomial g(x) that has d consecutive roots $\alpha^L, \alpha^{L+1} \ldots \alpha^{L+d-1}$ the system selects d−1 consecutive roots for the generator polynomial g'(x) of an RS [d−1] code (steps 300, 302). There are two choices for the roots of g'(x), namely $\alpha^{L+1}, \alpha^{L+2} \ldots \alpha^{L+d-1}$ and $\alpha^L, \alpha^{L+1} \ldots \alpha^{L+d-2}$. The system then selects from one of these RS [d−1] codes a coset leader $b_i(x)$ that is not also a codeword of the RS[d] code (step 304).

To determine if the selected coset leader is appropriate for mis-synchronization detection, the system tests that the term $$j(x)=b_i(x)*x^S+b_i(x)$$

is not a code word of the RS[d] code (steps 306, 308). The values of S range from −T to T, where T is the maximum size of the window that the system uses to find the synchronization patterns, which are recorded on the disk. The system thus looks at up to T symbols on either side of overhead information recorded between sectors to find the synchronization pattern. If the pattern is not found, the disk drive (not shown) typically repositions the read/write head and again tries to locate the synchronization pattern within the T-symbol windows. Accordingly, a read operation may be mis-synchronized by at most T symbols in either direction.

The coset leader $b_i(x)$ is tested by dividing it by the roots of the generator polynomial g(x) of the RS[d] code. If any of the roots does not divide $b_i(x)$, the coset leader is not a code word of the RS[d] code. The system next similarly tests the associated polynomial j(x) for each S of interest.

If the system cannot find an appropriate coset leader from the selected code, the system tests coset leaders from the other RS[d−1] code (steps 310, 312). If the system cannot find an appropriate coset leader, the system next tests coset leaders from the RS[d−2] codes that have generator polynomials with d−2 consecutive roots, and so forth (steps 310, 314).

The coset leaders for a given RS[d'] code may be generated from arbitrary data p(x) by encoding the data in accordance with the RS[d'] code. The generated code word $c_p(x)$ is then tested as discussed above to determine if it is a code word of the RS[d] code. If so, a new code word is produced as $c_p(x)=c_p(x)+x^a g'(x)$, and the code word is then tested. As appropriate, system produces and tests a next code word $c_p(x)=c_p(x)+x^{a+1}g'(x)$, and so forth.

When a code word $c_p(x)$ is produced that is not also a code word of the RS[d] code, the system sets $b_i(x)=c_p(x)$ and tests if $b_i(x)+b_i(x)*x^S$ is a code word in RS[d] for all S of interest. If so, the system modifies the data p(x) and produces and tests a new code word $c_p(x)$, and so forth. Generally, p(x) is set to all zeros.

Using this approach to producing the coset leader, the system must store the entire coset leader. To reduce the storage requirements, the system may instead produce the coset leader by manipulating a shortened code word of the RS[d'] code. The system then stores the shortened code word rather than the entire coset leader.

Figure 4:
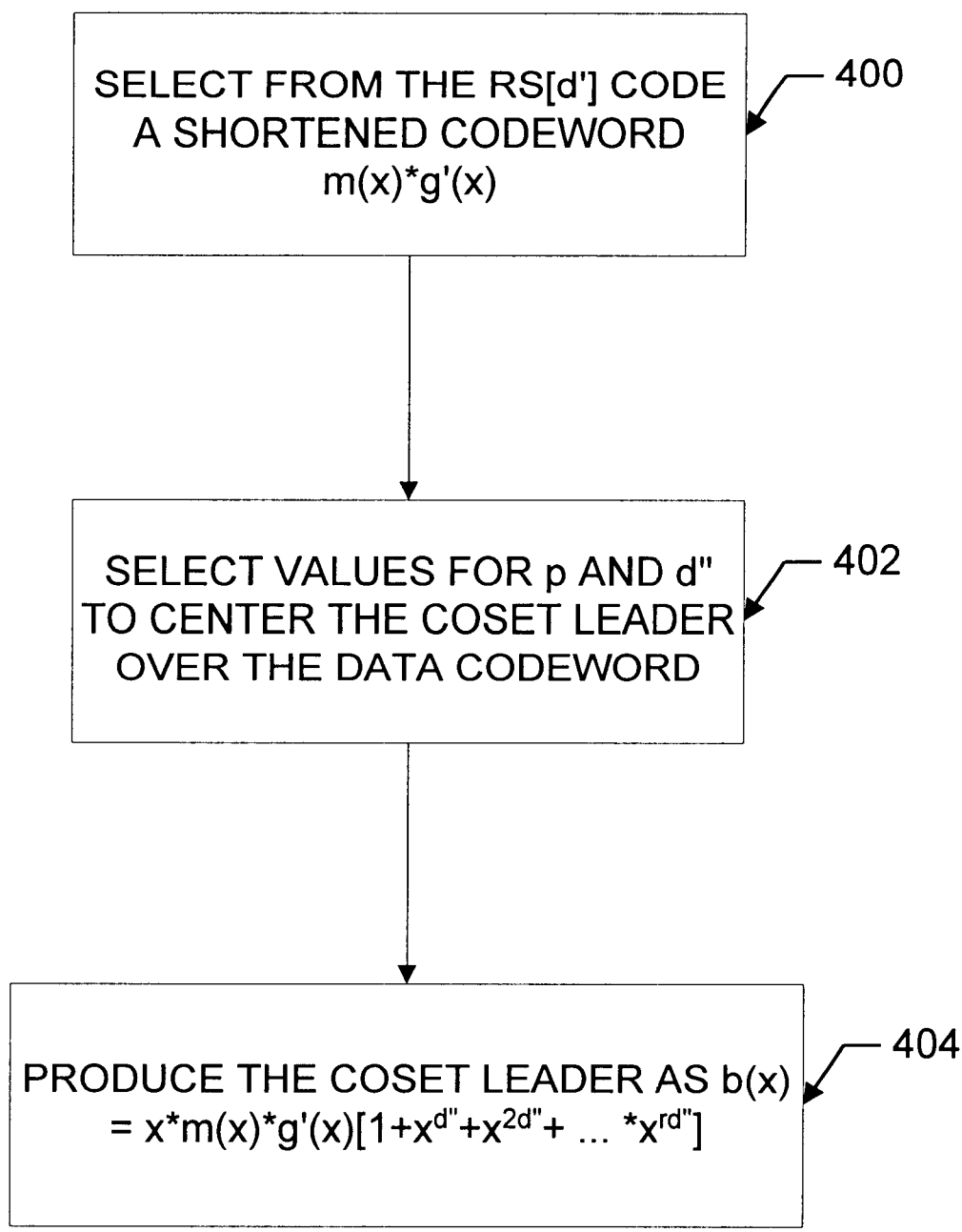
FIG. 4 is a flow chart of further operations of selecting a coset leader.

Referring now to FIG. 4, the system ignores the all-zero leading symbols of a code word of the RS[d'] code and produces the coset leader from the shortened code word m(x)*g'(x) (step 400). The coset leader is thus:

$$b_i(x)=x^{p}*m(x)*g'(x)*[1+x^{d''}+x^{2d''}+ \ldots +x^{rd''}]$$

where (step 402) d" is selected to be equal to or greater than the degree of m(x)*g'(x), and d" and p are selected essentially to "center" the coset leader in the data code word, and p+rd"+d'−1≦n where n is the code length. The coset leader, which is shifted p symbols from the start of the code word, includes r+1 copies of the shortened code word. If d" is greater than the degree of m(x)*g'(x)+1, there are zero-filled gaps between the to respective copies of m(x)*g'(x) in the coset leader. If p>T, the truncation of the recorded code word does not adversely affect the minimum distance by which the term $j(x)=b_i(x)*x^S+b_i(x)$ is separated from each of the valid code words of the RS[d] code, since the symbols of the coset leader are not included in the truncated symbols. Accordingly, the included term, which is a distance d' from every code word, should introduce a sufficient number of errors into any retrieved code word to cause the decoder to label the mis-synchronized data erroneous.

The polynomial m(x) may be set to an irreducible polynomial, and in most applications m(x) may be set equal to 1. The coset leader can be produced by repeated XOR'ing the shortened code word to the appropriate symbols in the data code word. Alternatively, the coset leader can be produced in a shift register, as discussed below with reference to FIG. 5. (step 404).

The system may instead produce the coset leader by multiplying the shortened code word m(x)*g'(x) by $\alpha^e$. The coset leader $$b_i(x)=x^{p}*m(x)*g'(x)*\{1+\alpha^{e}*x^{d''}+\alpha^{2e}*x^{d''}+ \ldots +\alpha^{re}*x^{rd''}\}$$

can then be produced by a linear shift register $12_e$ as depicted in FIG. 5. The shift register $12_e$ includes d−1 registers 30 that contain the coefficients of the polynomial $x^{p}*m(x)*g'(x)$ and a constant multiplier 32 that multiplies the contents of the registers by $\alpha^e$. The values of r and e are preferably selected such that $\alpha^{(r+1)e}=1$, and the contents of the registers 30 thus return to their initial state after r iterations.

If the multiplier 32 is either set to $\alpha^0=1$ or removed from the feedback path, the shift register $12_e$ may be used to repeatedly supply the term m(x)*g'(x) for XOR'ing to the data code word. The shift register can then be used to produce the coset leader $$b_i(x)=x^{p}*m(x)*g'(x)*[1+x^{d''}+x^{2d''}+ \ldots +x^{rd''}].$$

discussed above.

The coset leader may instead be produced by multiplying the term $x^{P}*m(x)*g'(x)$ by a different value of $a^j$ in each iteration. A shift register $12_j$, depicted in FIG. 6, includes the registers 30 discussed above and a multiplier 42, which is updated after each iteration to produce, for example:

$$b_i(x)=x^{p}*m(x)*g'(x)*\{1+\alpha^{a}*x^{d''}+\alpha^{a+1}*x^{d''}+ \ldots +\alpha^{r+a}*x^{rd''}\}$$

The multiplier 42 is thus updated from $\alpha^a$ to $\alpha^{a+1}$ after each iteration.

Figure 7:
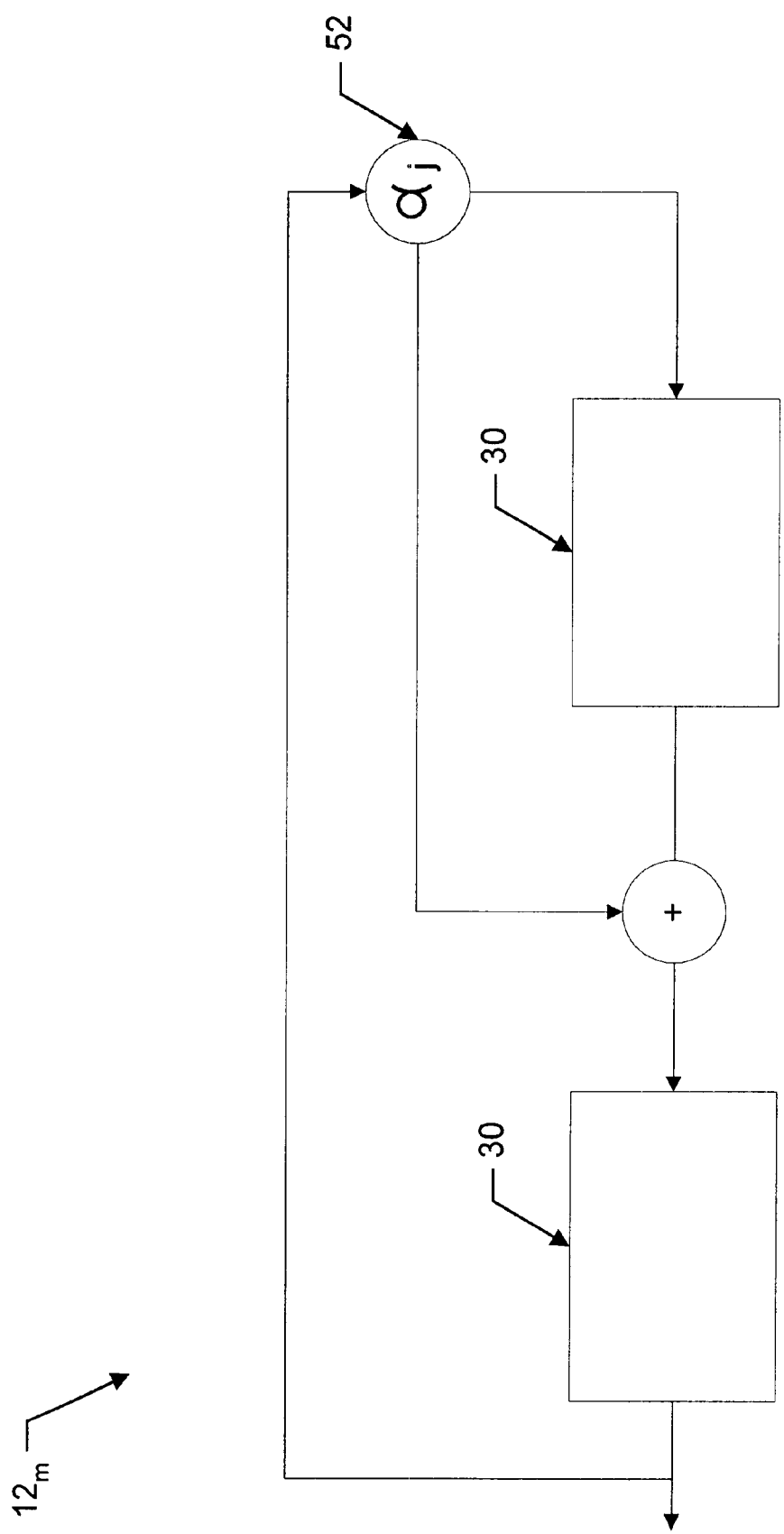
FIG. 7 is a functional block diagram of maximal length shift register for generating a coset leader.

Alternatively, the system may produce the data portion of the coset leader using a maximal length shift register $12_m$ that is set to a predetermined initial condition, as depicted in FIG. 7. The shift register $12_m$ produces an m-bit symbol at each iteration and can be used repeatedly to produce all of the symbols in the data section of the coset leader. The shift register is set up in accordance with a polynomial that has a period that is greater than the number of data symbols. As depicted in the drawing, the register $12_m$ may be a two-stage shift register that is set up in accordance with the polynomial $x^2+\alpha^j x+\alpha^j$, where $\alpha^j$ is a primitive element of the Galois Field.

The system stores the coset leader redundancy symbols, however, so that a separate encoder for the RS[d'] code is not required. The system must also store the initial state of the shift register, and the number of required iterations.

For some applications, the coset leader is a shortened code word that is XOR'd to only the redundancy symbols of the data code word. For most of these applications, the coset leader is $x^p g'(x)$ with the value p chosen to center the coset leader over the redundancy symbols. The system thus stores only $g'(x)$.

The system and methods described above include in a retrieved code word a term that is a selected distance from every valid data code word. This is in contrast to the noise-like sequences used by prior systems, which are found by trial and error, and are not necessarily separated from every valid data code word by a selected distance.

Further, the coset leader of the current system can be produced from a shortened code word of an RS[d'] code or generated using a linear shift register. This reduces the storage requirements from those of the prior systems, which must store the entire sequence.

What is claimed is:

1. An encoding system for use in detecting synchronization errors, the encoding system including:

A. an encoder for encoding data in accordance with a distance d Reed-Solomon or BCH code, the encoder producing a data code word;

B. means for producing a coset leader that is a code word of a distance d' Reed-Solomon or BCH code but not a code word of the distance d code, where $$\frac{d}{2} < d' < d;$$

and

C. an adder for adding the coset leader to the data code word to produce a code word for recording that includes a term that is a distance d' from every code word of the distance d code.

2. The encoding system of claim 1, wherein the means for producing the coset leader includes XOR gates that add to the data code word r+1 copies of a shortened code word of the distance d' code.

3. The encoding system of claim 2, wherein the means for producing the coset leader adds to the data code word r+1 copies of a shortened code word $m(x)*g'(x)$.

4. The encoding system of claim 3, wherein the system selects the polynomial $m(x)$ to be an irreducible polynomial.

5. The encoding system of claim 2, wherein the means for producing the coset leader produces:

$$b_i(x)=x^p*m(x)*g'(x)*[1+x^{d''}+x^{2d''}+x^{3d''}+\ldots+x^{rd''}]$$

where $m(x)*g'(x)$ is a shortened code word of the distance d' code, d" is greater than or equal to the degree of $m(x)*g'(x)$, $n \geq p+rd''+d'-1$, and $g'(x)$ is the generator polynomial of the distance d' code which has code length n.

6. The encoding system of claim 5, wherein the system selects a value of P to center the coset leader over the data code word.

7. The encoding system of claim 5, wherein the system selects the polynomial $m(x)$ to be an irreducible polynomial.

8. The encoding system of claim 2, wherein the means for producing the coset leader includes a shift register for producing the coset leader as:

$$b(x)=x^p*m(x)*g'(x)*[1+\alpha^e*x^{d''}+\alpha^{2e}*x^{2d''}+\ldots+\alpha^{re}*x^{rd''}].$$

where $m(x)*g'(x)$ is a shortened code word of the distance d' code, d" is greater than the degree of $m(x)*g'(x)$, $n \geq p+rd''+d'-1$, and $g'(x)$ is the generator polynomial of the distance d' code which has code length n.

9. The encoding system of claim 8, wherein the system selects a value of P to center the coset leader over the data code word.

10. The encoding system of claim 8, wherein the system selects the polynomial $m(x)$ to be an irreducible polynomial.

11. The encoding system of claim 1 wherein the distance d' code has a generator polynomial with d' consecutive roots.

12. The encoding system of claim 11 further including means for testing a term $b(x)*x^S+b(x)$, where $b(x)$ is the coset leader, $-T \leq S \leq T$ and T is the maximum number of symbols in the synchronization error, to determine that the term is not a code word of the distance d code.

13. A method for detecting synchronization errors in a data code word that is encoded in accordance with a distance d Reed-Solomon or BCH code, the method including the steps of:

A. selecting a coset leader $b(x)$ that is a code word of a distance d' Reed-Solomon or BCH code and not a code word of the distance d code used to encode data into the data code word, where d'<d;

B. testing the term $b(x)*x^S+b(x)$, where $-T \leq S \leq T$ and T is the maximum number of symbols in a synchronization error, to determine that the term is not a code word of the distance d code;

C. adding the coset leader to the data code word before recording;

D. adding the coset leader to a retrieved code word;

E. decoding the code word that is the result of step D and detecting errors in the code word;

F. labeling data as erroneous if the decoding step detects more errors than the distance d code can correct.

14. The method of claim 13 further including in the step of producing the coset leader the step of including in the coset leader r+1 copies of a shortened code word of the distance d' code.

15. The method of claim 14 further including in the step of producing the coset leader including in the coset leader r+1 copies of the shortened code word $m(x)*g'(x)$.

16. The method claim 15, wherein the step of producing the co set leader includes selecting the polynomial $m(x)$ to be an irreducible polynomial.

17. The method of claim 15 further includes in the step of producing the coset leader, producing the coset leader as:

$$b_i(x)=x^p*m(x)*g'(x)*[1+x^{d''}+x^{2d''}+x^{3d''}+\ldots+x^{rd''}]$$

where d" is greater than the degree of $m(x)*g'(x)$, $n \geq p+rd''+d'-1$, and $g'(x)$ is the generator polynomial of the distance d' code which has code length n.

18. The method of claim 17, wherein the step of producing the coset leader includes selecting a value of p to center the coset leader over the data code word.

19. The method of claim 15, wherein the step of producing the coset leader includes the step of producing the coset leader as:

$$b_i(x)=x^{p}*m(x)*g'(x)*[1+\alpha^{e}*x^{d''}+\alpha^{2e}*x^{2d''}+\ldots+\alpha^{re}*x^{rd''}].$$

where d" is greater than the degree of m(x)*g'(x), n≧p+rd"+d'−1, and g'(x) is the s generator polynomial of the distance d' code which has code length n.

20. The method of claim 19, wherein the step of producing the coset leader further includes selecting a value of p to center the coset leader over the data code word.

21. The method of claim 19, wherein the step of producing the coset leader includes selecting the polynomial m(x) to be an irreducible polynomial.

22. The method of claim 13, wherein the step of producing the coset leader includes selecting the distance d' code with a generator polynomial with d' consecutive roots.

23. The method of claim 22, further including the steps of a. selecting as the distance d' code a distance d'=d−1 code with a generator polynomial with d' consecutive roots;

b. if the d' distance code does not include a coset leader that tests appropriately for use in the mis-synchronization detection, selecting as the distance d' code a distance d'=d'−1 code with a generator polynomial with d' consecutive roots; and c. repeating steps a and b if the d' distance code does not include a coset leader that tests appropriately for use in the mis-synchronization detection.

24. The method of claim 13, wherein the step of adding the coset leader includes adding the coset leader to data code word redundancy symbols.

* * * * *